United States Patent
Nalbant

(10) Patent No.: US 8,598,897 B2
(45) Date of Patent: Dec. 3, 2013

(54) ISOLATION MONITORING SYSTEM AND METHOD UTILIZING A VARIABLE EMULATED INDUCTANCE

(75) Inventor: Mehmet Kadri Nalbant, Cupertino, CA (US)

(73) Assignee: Maxim Integrated Products, Inc., San Jose, CA (US)

(*) Notice: Subject to any disclaimer, the term of this patent is extended or adjusted under 35 U.S.C. 154(b) by 438 days.

(21) Appl. No.: 13/012,140

(22) Filed: Jan. 24, 2011

(65) Prior Publication Data

US 2011/0181306 A1 Jul. 28, 2011

Related U.S. Application Data

(60) Provisional application No. 61/298,347, filed on Jan. 26, 2010.

(51) Int. Cl.
  *G01R 27/08* (2006.01)
  *G01N 27/416* (2006.01)

(52) U.S. Cl.
  USPC ............ 324/691; 324/698; 324/434; 324/713

(58) Field of Classification Search
  USPC ......... 324/713, 652, 655, 668, 675, 682, 708; 331/181
  See application file for complete search history.

(56) References Cited

U.S. PATENT DOCUMENTS

| | | |
|---|---|---|
| 3,696,367 A | 10/1972 | Inamdar |
| 3,700,966 A | 10/1972 | Morrow |
| 3,754,221 A | 8/1973 | Stelter |
| 3,786,466 A | 1/1974 | Naito et al. |
| 3,801,898 A | 4/1974 | Young |
| 3,947,759 A | 3/1976 | Briggs |
| 4,002,968 A | 1/1977 | Reid |
| 4,151,460 A | 4/1979 | Seese et al. |
| 4,206,398 A | 6/1980 | Janning |
| 4,253,056 A | 2/1981 | Chaudhary |
| 4,417,202 A | 11/1983 | Pascoe |

(Continued)

FOREIGN PATENT DOCUMENTS

| | | |
|---|---|---|
| EP | 0913697 A2 | 5/1999 |
| JP | 2000502177 | 2/2000 |
| KR | 20040092016 | 11/2004 |
| KR | 20050001898 | 1/2005 |

OTHER PUBLICATIONS

John Broskie, "John Broskie's Guide to Tube Circuit Analysis & Design", Jun. 24, 2007 http://www.tubecad.com/2007/06/blog0112.htm.*

(Continued)

*Primary Examiner* — Vinh Nguyen
*Assistant Examiner* — Hoang X Nguyen

(57) ABSTRACT

A system for measuring leakage resistance between a high voltage (HV) system of a vehicle and a vehicle chassis includes an emulated inductance that is connected between the HV system and the vehicle chassis and that has an inductive reactance that substantially cancels a capacitive reactance between the HV system and the vehicle chassis. A signal source outputs one of an AC current signal and an AC voltage signal between the HV system and the vehicle chassis. A sensor measures one of an AC current response to the AC voltage signal between the HV system and the vehicle chassis and an AC voltage response to the AC current signal between the HV system and the vehicle chassis.

17 Claims, 11 Drawing Sheets

(56) References Cited

U.S. PATENT DOCUMENTS

| | | |
|---|---|---|
| 4,472,676 A | 9/1984 | Eichmann et al. |
| 4,638,245 A | 1/1987 | MacPhee et al. |
| 4,679,111 A | 7/1987 | Koch et al. |
| 4,809,123 A | 2/1989 | Allington et al. |
| 4,896,115 A | 1/1990 | LeMaitre et al. |
| 4,929,901 A | 5/1990 | Kimball et al. |
| 5,101,160 A | 3/1992 | Barjonnet et al. |
| 5,146,397 A | 9/1992 | Fruhling |
| 5,382,946 A | 1/1995 | Gale |
| 5,481,194 A | 1/1996 | Schantz et al. |
| 5,508,872 A | 4/1996 | Khoo et al. |
| 5,510,725 A | 4/1996 | Schantz, Jr. et al. |
| 5,530,360 A | 6/1996 | Kerchaert et al. |
| 5,561,380 A | 10/1996 | Sway-Tin et al. |
| 5,686,839 A | 11/1997 | Takagi |
| 5,712,572 A | 1/1998 | Tamechika et al. |
| 5,745,322 A * | 4/1998 | Duffy et al. .................. 361/45 |
| 5,760,488 A | 6/1998 | Sonntag |
| 5,760,587 A * | 6/1998 | Harvey ...................... 324/434 |
| 5,811,976 A | 9/1998 | Fischer |
| 5,990,685 A | 11/1999 | Nightall |
| 6,084,755 A | 7/2000 | Roberts et al. |
| 6,320,389 B1 | 11/2001 | Tamesue et al. |
| 6,678,132 B1 | 1/2004 | Carruthers et al. |
| 6,724,589 B1 * | 4/2004 | Funderburk .................. 361/42 |
| 6,794,879 B2 | 9/2004 | Lawson et al. |
| 6,833,708 B2 | 12/2004 | Furukawa |
| 6,856,137 B2 | 2/2005 | Roden et al. |
| 6,919,726 B2 | 7/2005 | Yudahira |
| 6,970,807 B2 | 11/2005 | Kito et al. |
| 6,998,819 B2 | 2/2006 | Jin |
| 7,026,788 B2 | 4/2006 | Yano et al. |
| 7,049,825 B2 | 5/2006 | Carruthers |
| 7,102,356 B2 | 9/2006 | Wild |
| 7,629,794 B2 | 12/2009 | Kamata |
| 2001/0003500 A1 * | 6/2001 | Cheze et al. .................. 361/93.1 |
| 2002/0121902 A1 * | 9/2002 | Suzuki ...................... 324/509 |
| 2004/0075438 A1 | 4/2004 | Muldoon |
| 2005/0017738 A1 * | 1/2005 | Lin et al. .................... 324/698 |
| 2007/0285057 A1 | 12/2007 | Yano |
| 2009/0179655 A1 | 7/2009 | Magana et al. |
| 2009/0184718 A1 | 7/2009 | Ivan et al. |
| 2009/0228163 A1 | 9/2009 | Tarchinski |
| 2009/0319212 A1 * | 12/2009 | Cech et al. .................... 702/65 |

OTHER PUBLICATIONS

Notification of Transmittal of the International Search Report and the Written Opinion of the International Searching Authority, or the Declaration dated Sep. 27, 2011 in reference to PCT/US2011/022569 (8 pgs).

* cited by examiner

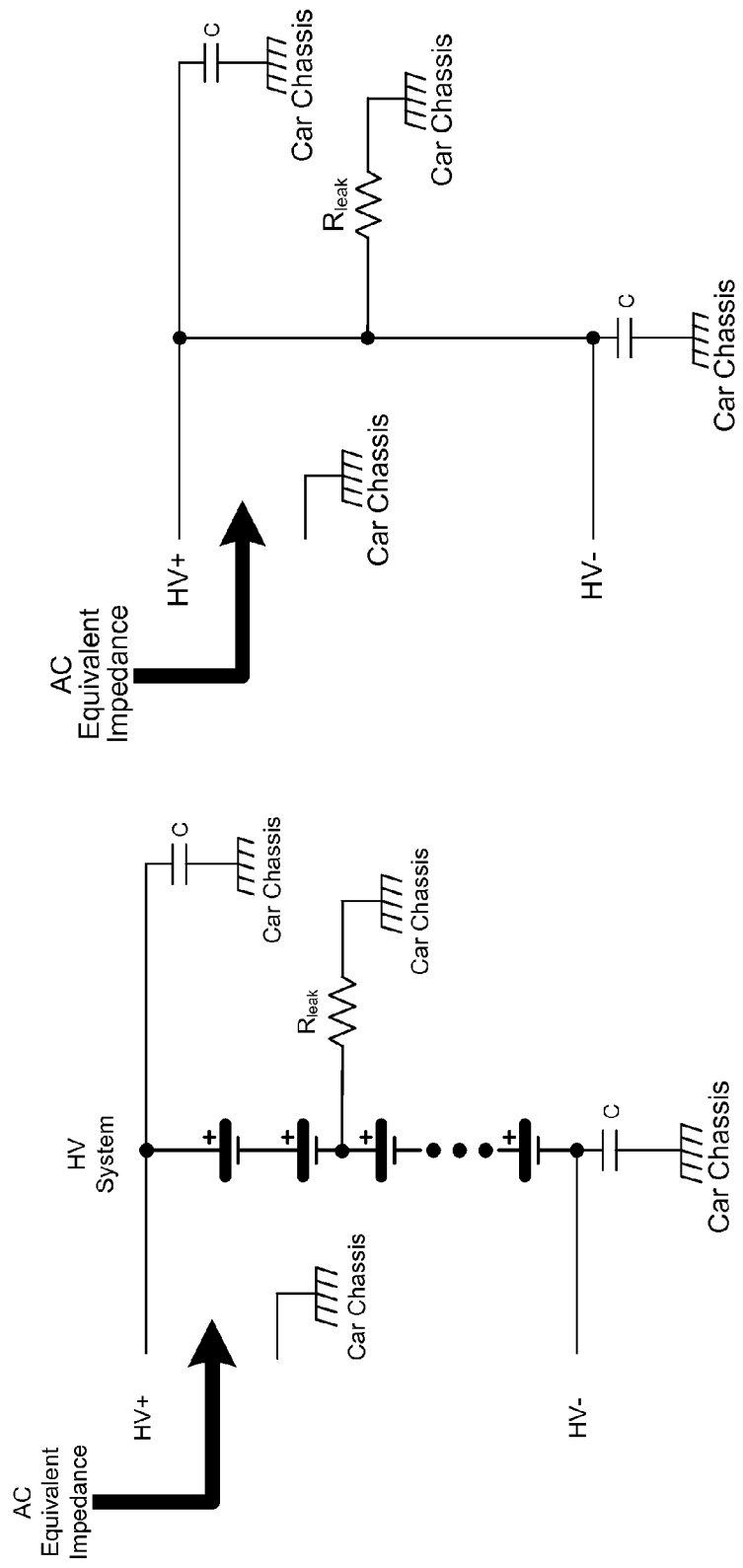

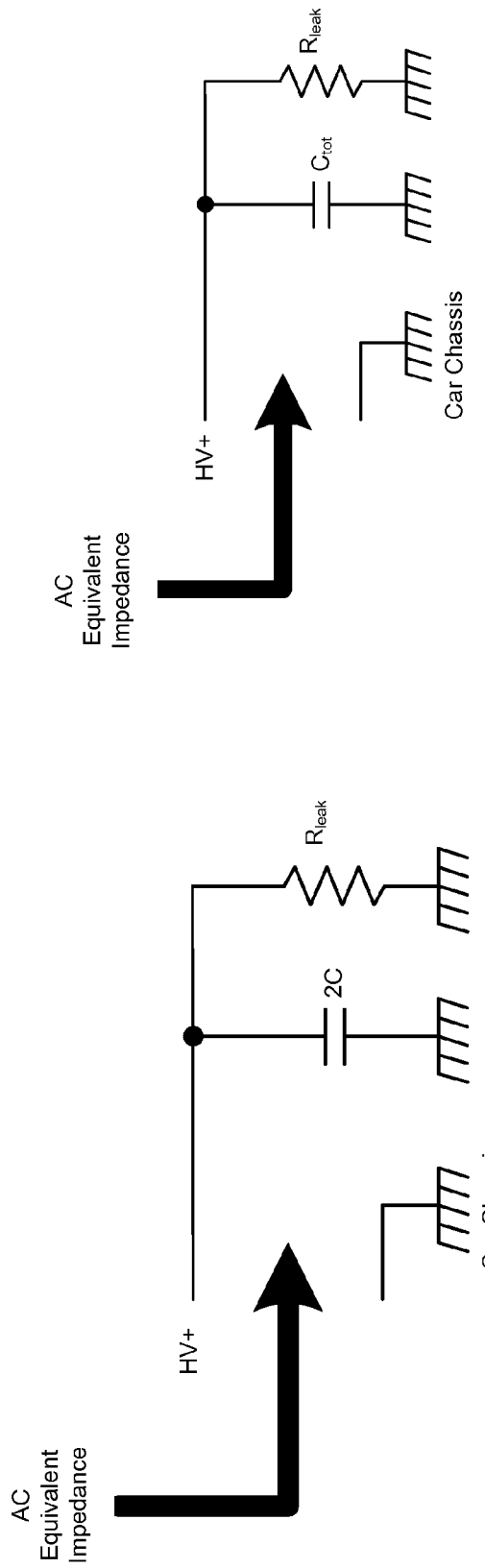

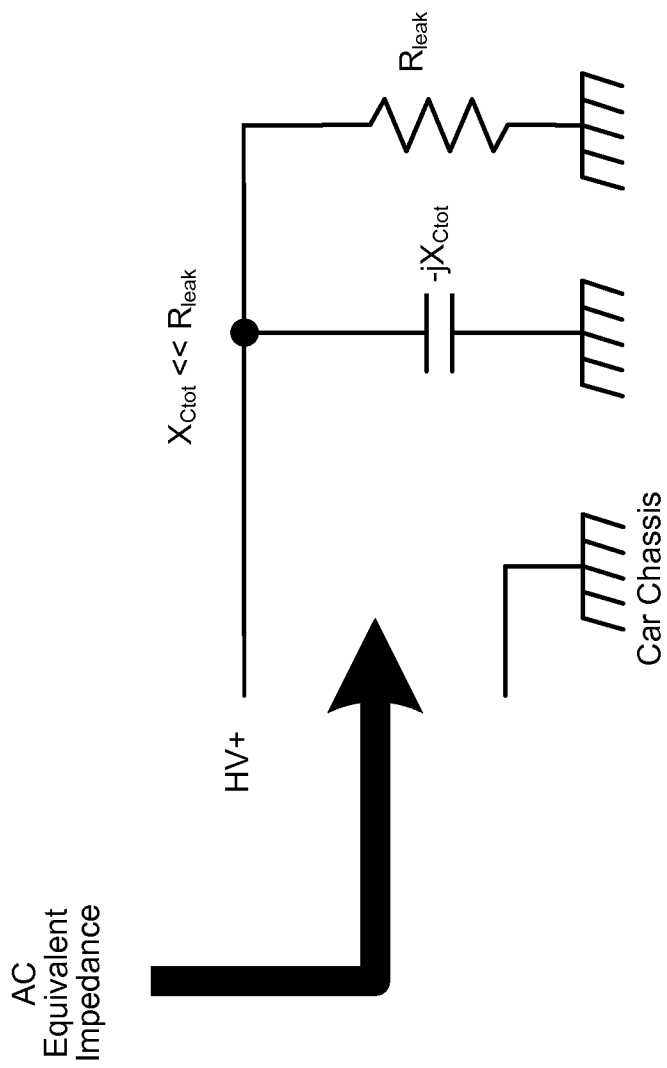

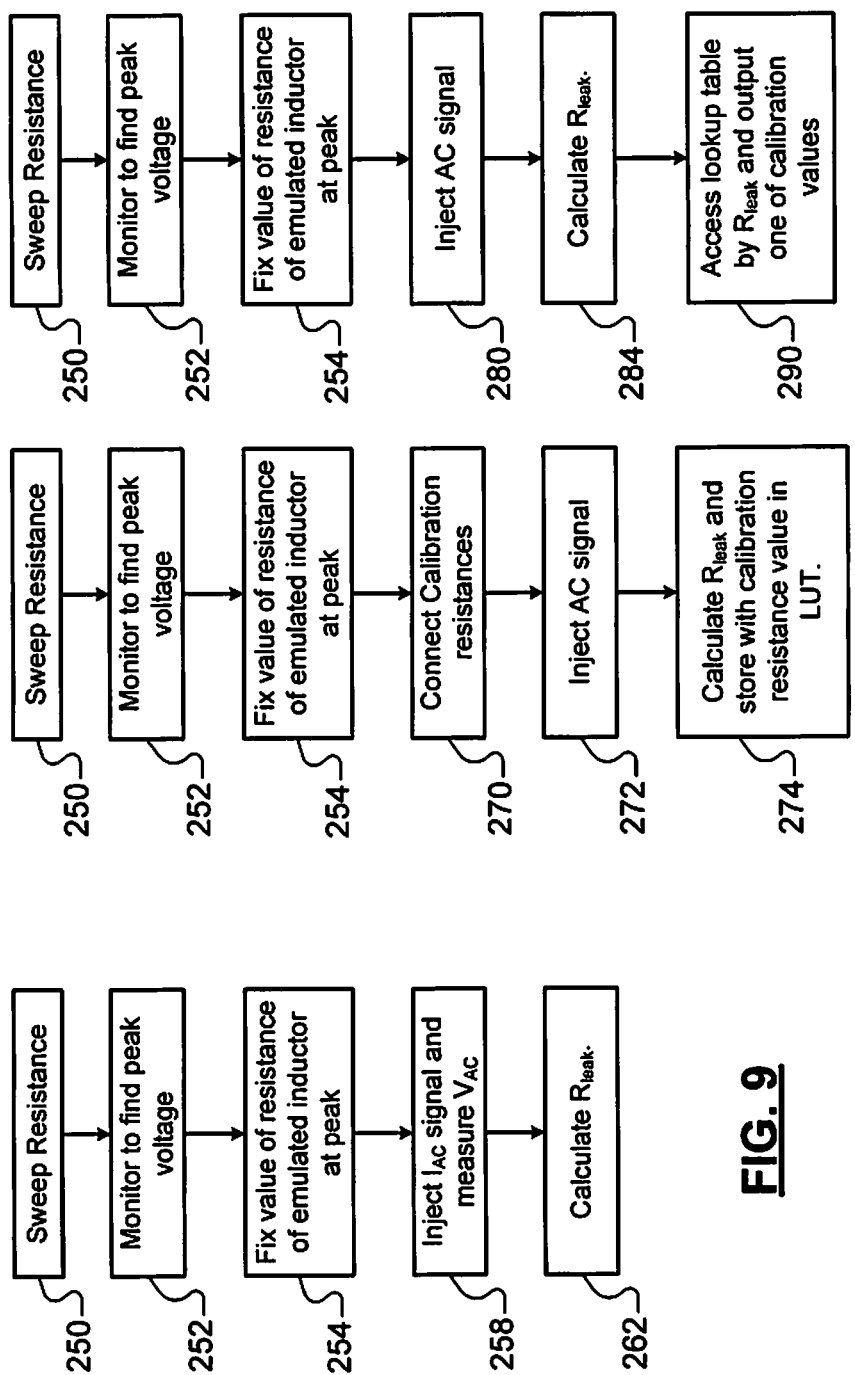

ISOLATION MONITORING SYSTEM AND METHOD UTILIZING A VARIABLE EMULATED INDUCTANCE

CROSS-REFERENCE TO RELATED APPLICATIONS

This application claims the benefit of U.S. Provisional Application No. 61/298,347, filed on Jan. 26, 2010. The disclosure of the above application is incorporated herein by reference in its entirety.

FIELD

The present disclosure relates to vehicles, and more particularly to isolation monitoring systems and methods for electric, hybrid electric and fuel cell vehicles.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In some vehicles, a high voltage (HV) battery may be used to provide power to an inverter and electric motor, which drives one or more wheels of the vehicle. The HV battery may operate at a high voltage such as 250V to 1000V DC. Accessories and other vehicle systems may be powered by a low voltage (LV) system such as a 12V DC battery. For safety reasons, the HV battery and all circuits connected to the HV battery should be Galvanically isolated from the vehicle chassis as well as other systems of the vehicle.

For example only, there can be physical and parasitic capacitive coupling from the inverter to the chassis, from the electric motor to the chassis as well as undesirable leakage resistance from the electric motor or HV side of the inverter to the chassis. To ensure safety, isolation of the HV battery is monitored. When an isolation problem is detected, the monitoring system may alert the vehicle operator and/or take action.

Isolation monitoring circuits for the HV battery may use DC or AC monitoring methods. In DC monitoring methods, the HV battery (or HV electrical power source) pushes current through the leakage impedance to the chassis. The resultant current or voltage is measured across another high value resistance. In AC monitoring methods, a small AC current is injected into the HV battery and the resultant AC voltage or current is measured.

In the DC monitoring method, direct and indirect connection methods can be used. In the indirect approach, one or more optical switches are used to indirectly connect the HV rails through a high impedance to the chassis. The optical switches tend to be expensive. Temperature and aging variation of the optical switches may create potentially erroneous measurements that may be false negatives thus creating the possibility of shock hazards. With DC isolation fault detection methods, fault detection generally cannot be performed when the HV battery is removed.

In the direct approach, the potential of the HV battery is also required. Fault detection is also not possible when the HV battery is removed. Both variants may have issues with large parasitic and system filter capacitors as well as operating reliably in noisy environments. Additionally this approach creates an intentional leakage path from the HV battery to the chassis to complete the measurement circuit, which is contrary to the goal of isolation.

Advantages of the AC monitoring method relative to the DC monitoring method include the ability to utilize a capacitor to inject the signal, which eliminates the need for the optical switches. Another advantage is the ability to run isolation tests without having the HV battery installed. However, in many cases, reactive shunt AC impedance is much lower than the fault impedance itself, which makes reliable isolation monitoring measurements difficult.

SUMMARY

A system for measuring leakage resistance between a high voltage (HV) system of a vehicle and a vehicle chassis includes an emulated inductance that is connected between the HV system and the vehicle chassis and that has an inductive reactance that substantially cancels a capacitive reactance between the HV system and the vehicle chassis. A signal source outputs one of an AC current signal and an AC voltage signal between the HV system and the vehicle chassis. A sensor measures one of an AC current response to the AC voltage signal between the HV system and the vehicle chassis and an AC voltage response to the AC current signal between the HV system and the vehicle chassis.

In other features, a control module that calculates a leakage resistance based on one of the AC current signal and the AC voltage response and the AC voltage signal and the AC current response. The emulated inductance value can be varied. The control module adjusts the value of the emulated inductance to N different values, where N is an integer greater than one, to vary the inductive reactance of the emulated inductance.

In other features, the emulated inductance includes a variable resistance. The control module adjusts the variable resistance of the emulated inductance to N different values, where N is an integer greater than one, to vary the inductive reactance of the emulated inductance. The control module selects one of the N values that cancels with capacitive reactance between the HV system and the vehicle chassis.

In other features, the control module calculates the leakage resistance between the HV system and the vehicle chassis by causing the signal source to generate the one of the AC current signal and the AC voltage signal while the one of the N values is selected. The emulated inductance further comprises an opamp including an inverting input and a non-inverting input. A first resistance is connected between the HV system and the inverting input of the opamp.

In other features, the emulated inductance further comprises a capacitance connected between the HV system and the non-inverting input of the opamp. The variable resistance is connected to the non-inverting input. A first capacitance, a first resistance and a second resistance are connected in series between the HV system and the vehicle chassis. An analog to digital converter has a first input connected between the first and second resistance and an output connected to the control module.

In other features, the control module generates T values of the leakage resistance, selects S of the T values, where S and T are integers greater than two and S<T, and calculates a final leakage resistance value as a function of the S values. The control module selects the S values based on an enable signal received from one of a HV controller and a vehicle system controller.

In other features, the control module includes a sampling module that samples a plurality of half cycles of the one of the AC voltage response and the AC current response. A correlation module generates a plurality of correlation values corresponding to the plurality of half cycles of the one of the AC voltage response and the AC current response.

In other features, a leakage calculating module calculates the leakage resistance based on selected ones of the plurality of half cycles of the one of the AC voltage response and the AC current response having correlation values that are greater than a predetermined correlation value.

In other features, the correlation module generates the plurality of correlation values by correlating each of the plurality of half cycles of the one of the AC voltage response and the AC current response with one of another one of the plurality of half cycles of the one of the AC voltage response and the AC current response and a predetermined waveform.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 2A-2D are electric schematics illustrating AC equivalent impedances of the system in FIG. 1;

FIG. 3 is an electrical schematic of the AC equivalent impedance;

FIGS. 9-11 are example methods for measuring isolation;

DETAILED DESCRIPTION

Figure 1:
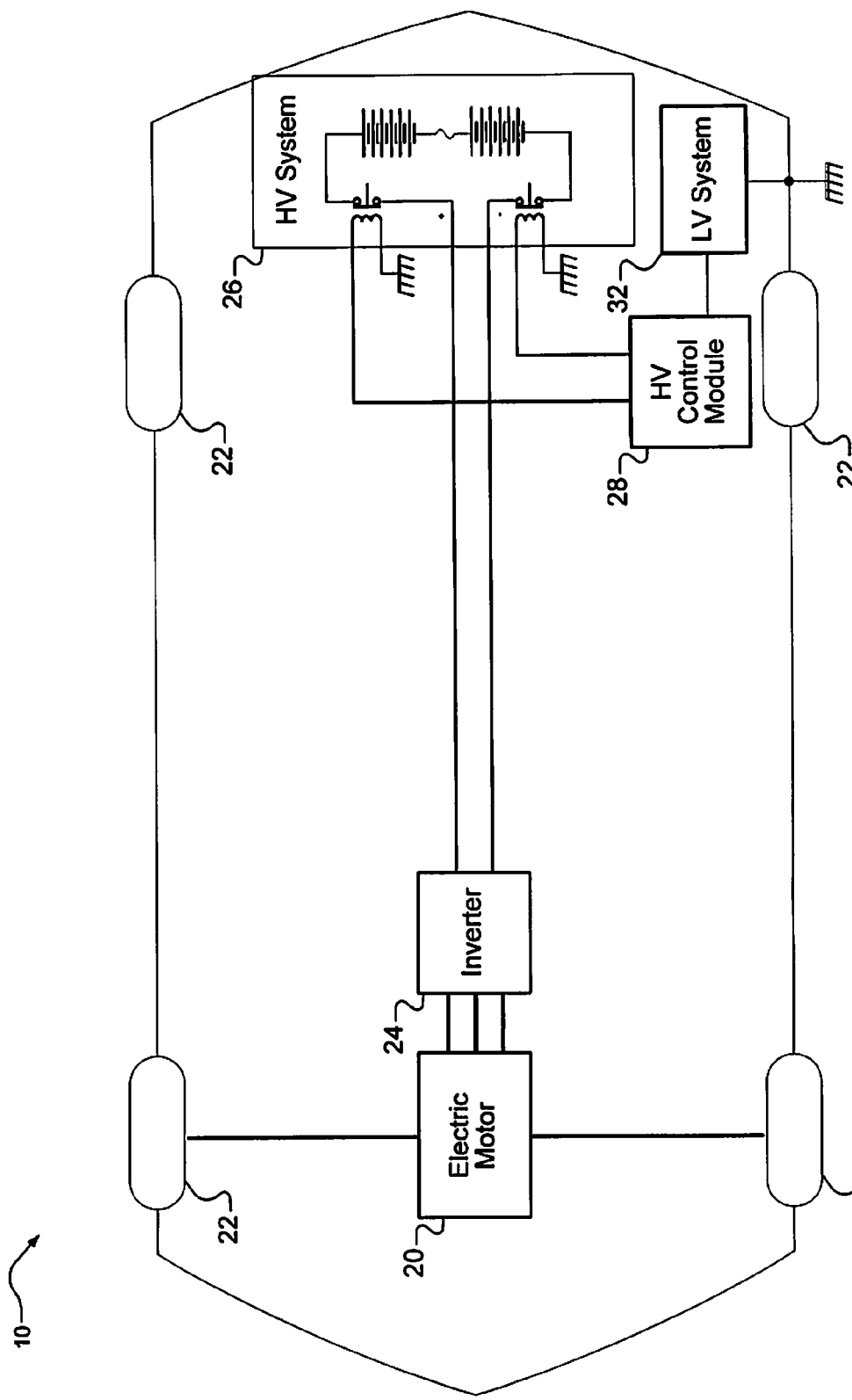
FIG. 1 is a functional block diagram of a vehicle with a HV system, a LV battery system, an inverter and an electric motor.

The following description is merely illustrative in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group); other suitable components that provide the described functionality; or a combination of some or all of the above, such as in a system-on-chip. The term module may include memory (shared, dedicated, or group) that stores code executed by a processor.

The term code, as used above, may include software, firmware, and/or microcode, and may refer to programs, routines, functions, classes, and/or objects. The term shared, as used above, means that some or all code from multiple modules may be executed using one or more processors. In addition, some or all code from multiple modules may be stored in or more physical memory locations. The term group, as used above, means that some or all code from a single module may be executed using a group of processors. In addition, some or all code from a single module may be stored using a group of memories.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

Control systems and methods according to the present disclosure use an emulated inductive reactance that substantially cancels system capacitive reactance and to determine a value of the leakage resistance $R_{leak}$. As used herein, substantially cancelling shall refer to sufficient cancellation to allow measurement of the leakage resistance within a desired tolerance. While the present disclosure will be described in the context of a HV system with HV batteries, other systems may rely on other types of storage devices such as fuel cells or HV power sources such as turbines. Still other HV storage devices and HV power sources are contemplated. As use herein, HV system may refer to the entire electrical system including battery, inverter, motor, the air-conditioning system, and other auxiliary equipment deriving power and/or connected to high voltages.

Referring now to FIG. 1, an example hybrid vehicle 10 is shown to include an electric motor 20 that drives one or more wheels 22 of the vehicle 10. The electric motor 20 may be coupled to an inverter 24, which inverts DC power from a HV battery system 26, or for example a fuel cell or some other form of HV electrical power generation system. A HV control module 28 controls operation of the HV system 26. The vehicle 10 may also include a LV battery system 32.

Referring now to FIGS. 2A-2D, the AC equivalent impedance across the HV system is shown to include capacitive coupling of capacitances C (such as Y-capacitors) and resistive coupling $R_{leak}$ to the car chassis. In FIG. 2B, the equivalent of the HV battery or power source is a short circuit to the test signal when testing using the AC method. In FIG. 2C, the circuit of FIG. 2B can be simplified as a parallel combination of a capacitance 2C and the resistance $R_{leak}$. In FIG. 2D, the capacitance 2C is replaced by a capacitance $C_{tot}$, which represents Y-capacitors, wiring to chassis capacitance, inverter to chassis capacitance, battery to chassis capacitance, electric motor to stator/chassis capacitance, etc.

Figure 4:
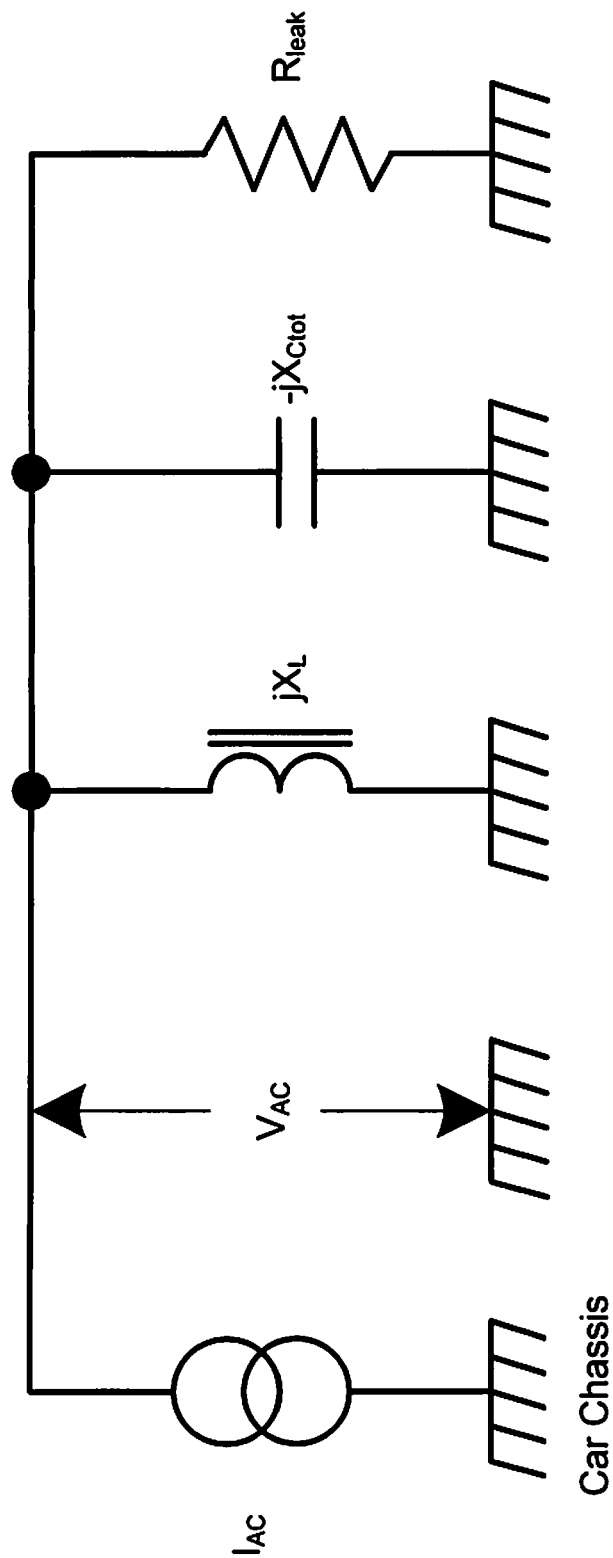
FIG. 4 is an electrical schematic showing canceling of capacitive reactance using the inductive reactance of a physical inductor.

Referring now to FIGS. 3 and 4, there is a challenge measuring the leakage resistance $R_{leak}$ when a value of the resistance $R_{leak}$ is much greater than the capacitive reactance $X_{Ctot}$. In FIG. 3, the value of the resistance $R_{leak}$ is usually an order of magnitude greater than the capacitive reactance $X_{Ctot}$ in most vehicles. In FIG. 4, the inductive reactance of a physical inductor $jX_L$ can be used to cancel the capacitive reactance $-jX_{Ctot}$. When the capacitive reactance $-jX_{Ctot}$ is equal to the inductive reactance $jX_L$, then the resistance $R_{leak}$ is equal to $V_{AC}/I_{AC}$. In practice, however, the value of the physical inductor $jX_L$ may need to be on the order of 2000 to 10,000 H, which is impractical. Furthermore, the exact value of the capacitive reactance $X_{Ctot}$ is not precisely known and/or may vary during operation.

Figure 5:
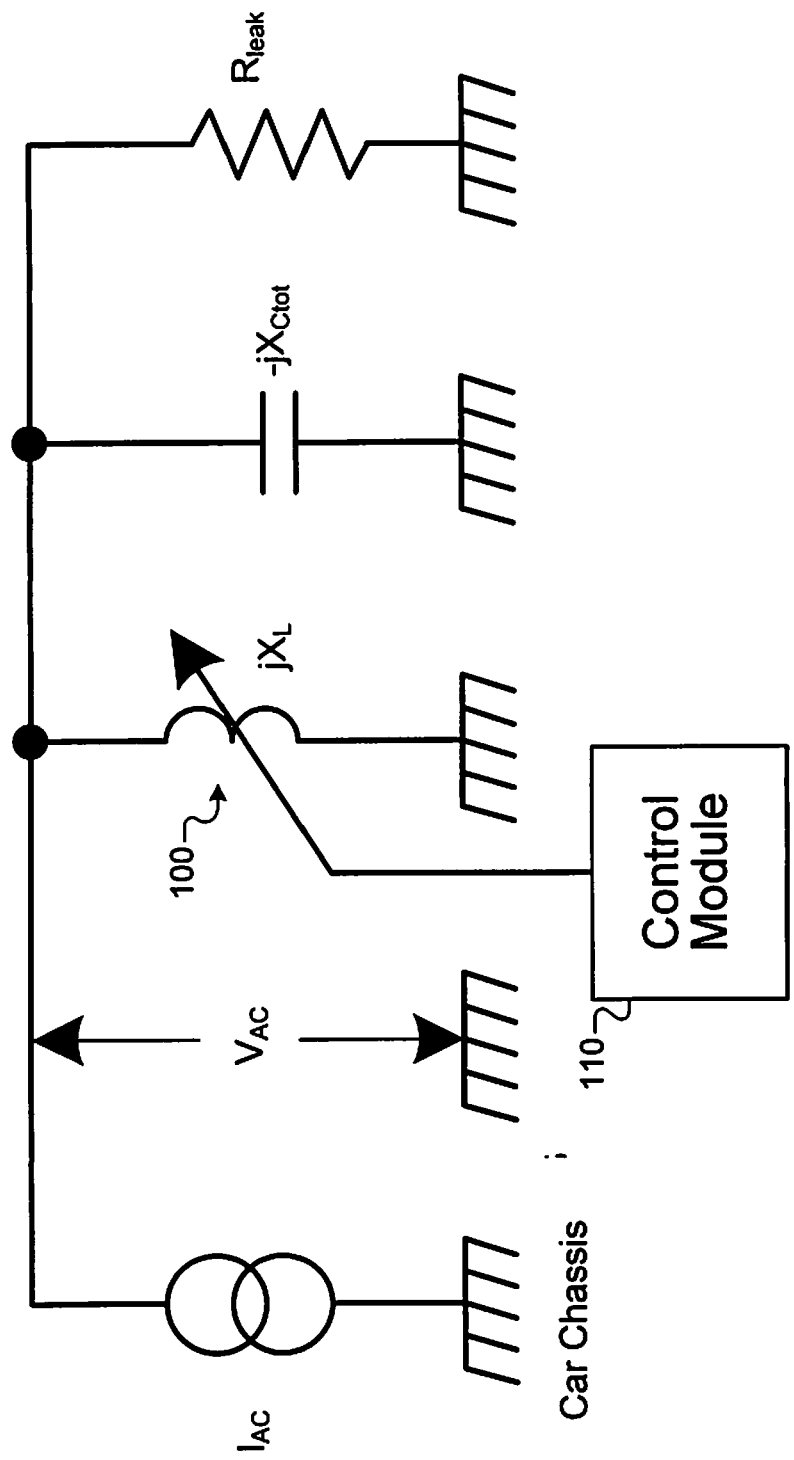
FIG. 5 is an electrical schematic showing canceling of the capacitive reactance using a control module and a emulated variable inductance according to the present disclosure.

Referring now to FIG. 5, a simplified schematic and functional block diagram shows an isolation monitoring system that includes a emulated variable inductance identified at 100 and a control module 110 that sweeps the emulated inductance as will be described further below. As used herein, the term emulated inductance shall include a combination of circuit elements such as capacitors, resistors, opamps, etc. that are used to generate the inductive reactance that is needed to offset the capacitive reactance between the HV system and the chassis. In addition, the emulated inductance can also be implemented using a processor, memory and software running inductor emulation software.

The control module 110 determines when the inductive reactance $jX_L$ of the emulated inductance is equal to the capacitive reactance of $-jX_{Ctot}$ and then measures the resistance $R_{leak}$. More particularly, the emulated variable inductance 100 is swept until a resonant peak is determined. While an AC current signal source is shown, an AC voltage source can be used and the AC current response can be measured.

Figure 6:
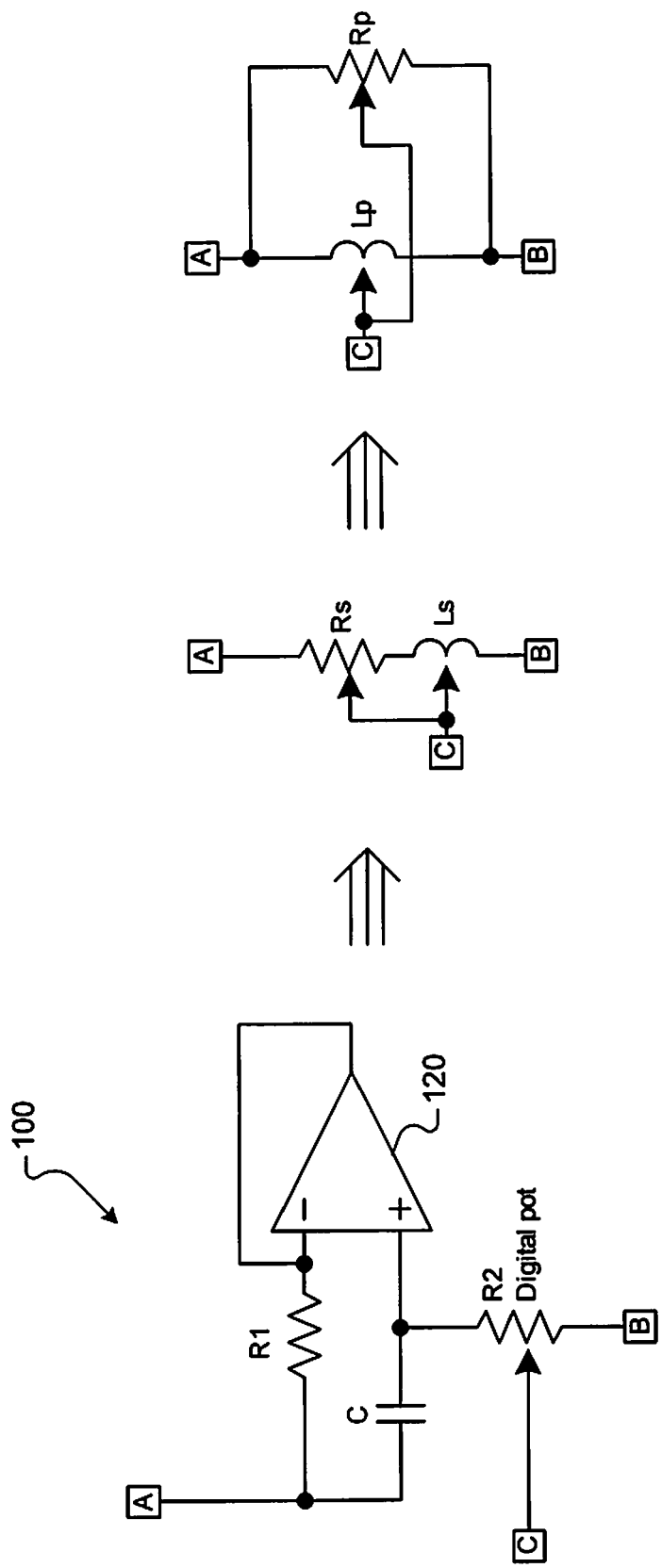
FIG. 6 is an electrical schematic of an example of the emulated variable inductance and equivalent circuits in series and in parallel.

Referring now to FIG. 6, an example of the emulated variable inductance 100 is shown in more detail. The emulated variable inductance 100 includes a resistance $R_1$, a capacitance C, an opamp 120 and a variable resistance $R_2$. The emulated variable inductance 100 includes terminals A and B that are connected between the HV system and the chassis. The control module 110 varies the value of the resistance $R_2$ during the sweep via a terminal C. The resistance $R_1$ is connected between the terminal A and an inverting input of the opamp 120. The capacitance C is connected between the terminal A and the non-inverting input of the opamp 120. The variable resistance $R_2$ is connected to the non-inverting input of the opamp 120. The output of the opamp 120 is connected to the inverting input. For example only, the variable resistance $R_2$ can be a digital or analog potentiometer, switched resistors, pairs of resistors and transistors, etc.

A series equivalent circuit to the emulated inductance is an inductor $L_s$ and a resistance $R_s$ connected in series:

$$Rs = \frac{R1 \cdot (1 + R1 \cdot R2 \cdot \omega^2 \cdot C^2)}{1 + R1^2 \cdot \omega^2 \cdot C^2};$$

$$Ls = \frac{R1 \cdot (R2 - R1) \cdot C}{1 + R1^2 \cdot \omega^2 \cdot C^2}$$

A parallel equivalent circuit to the emulated inductance is an inductor $L_s$ and a resistance $R_s$ connected in parallel:

$$Rp = \frac{\omega^2 \cdot Ls^2 + RS^2}{RS}; \text{ and}$$

$$Lp = \frac{\omega^2 \cdot Ls^2 + Rs^2}{\omega^2 \cdot Ls}$$

Figure 7:
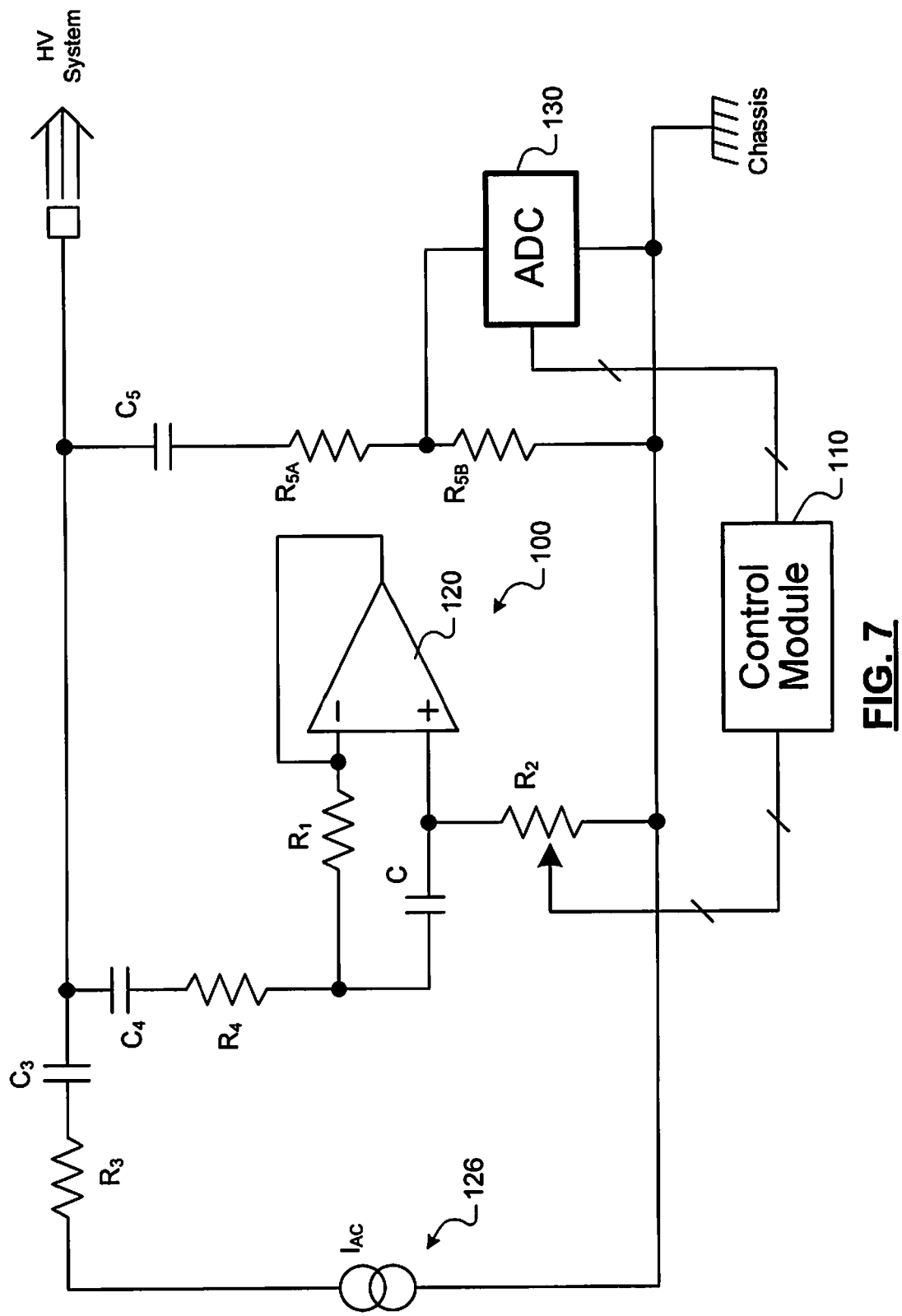
FIG. 7 is a more detailed electrical schematic and functional block diagram of an isolation monitoring system according to the present disclosure.

Referring now to FIG. 7, a measurement system is shown to include the emulated variable inductance 100, the control module 110, a current source 126, and an analog to digital converter (ADC) 130. Although not necessary in one exemplary implementation the control module 110 may communicate with the ADC 130 and control a value of the variable resistance $R_2$. The current source 126 generates an AC current signal $I_{AC}$. The current source 126 is connected by resistance $R_3$ and capacitance $C_3$ to the HV system and to the emulated variable inductance 100 via capacitance $C_4$ and resistance $R_4$. A capacitance $C_5$ and a voltage divider, which includes resistors $R_{5A}$ and $R_{5B}$, are connected between the HV system and the chassis. The ADC 130 communicates with the voltage divider.

For example, the current source 126 may have an amplitude of 5 μA or higher and a frequency between 0.5 Hz and 10 Hz, although other values may be used. Example values of the capacitances $C_3$, $C_4$, and $C_5$ are 0.2 μF, 2 μF, and 2 to 10 nF, respectively, although other values may be used. Example values of the resistances $R_2$, $R_3$, $R_4$, and $R_{5A}$ are 10 kΩ, 0.1 to 1 kΩ, 1 to 3 MΩ, and 10 MΩ, respectively, although other values may be used.

Figure 8:
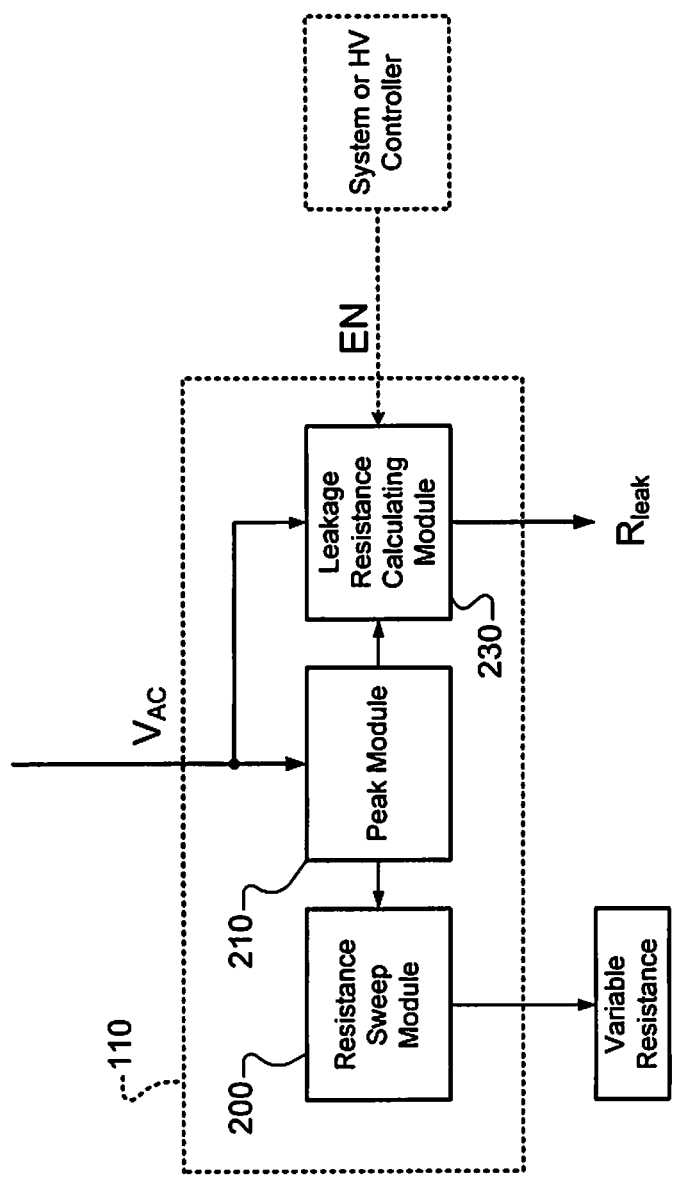
FIG. 8 is a partial functional block diagram of an example control module to measure isolation.

Referring now to FIG. 8, an example implementation of the control module 110 is shown to include a resistance sweep module 200, a peak module 210, and a leakage resistance calculating module 230. The resistance sweep module 200 varies a value of the variable resistance $R_2$. The peak module 210 identifies a value of the resistance $R_2$ when the peak voltage occurs. Once the peak voltage has been determined, the peak module 210 sets the value of the variable resistance $R_2$.

The leakage resistance calculating module 230 calculates the value of the leakage resistance $R_{leak}$ when the variable resistance $R_2$ is set to the value at the peak voltage. In some examples, the leakage resistance calculating module 230 may calculate the leakage resistance $R_{leak}$ over multiple samples. In other examples, some of the samples may be declared invalid when they occur during certain vehicle operating conditions such as braking, acceleration and/or other conditions that are likely to alter the validity of isolation measurements. In some implementations therefore, the leakage resistance calculating module 230 may receive an enable/disable signal from a system controller or the high voltage controller to enable or disable a leakage resistance calculation for a particular sample.

Referring now to FIGS. 9-11, several example methods for calculating the leakage resistance $R_{leak}$ are shown. In FIG. 9, the variable resistance $R_2$ is swept at 250. At 252, a peak is identified for a particular resistance value of the variable resistance $R_2$. At 254, control sets a value of the variable resistance $R_2$ to the value that occurred at the peak. At 258, the current source injects the current signal $I_{AC}$ and the voltage $V_{AC}$ is measured or vice versa. At 262, the leakage resistance $R_{leak}$ is calculated. As can be appreciated, blocks 250, 252 and 254 may be performed at the factory and the selected resistance value for the variable resistance $R_2$ may be stored before the vehicle leaves the factory. Alternately, blocks 250, 252 and 254 may be performed while the vehicle is on the road for each measurement, periodically or at other intervals.

In FIG. 10, blocks 250, 252 and 254 are performed as described above. At 270, a calibration resistance is connected from a point of the HV system to the chassis. The AC current signal $I_{AC}$ is injected and the voltage $V_{AC}$ is measured at 272. At 274, the leakage resistance $R_{leak}$ is calculated and stored with a value of the selected calibration resistance in a lookup table (LUT). Additional calibration values are connected and $R_{leak}$ is measured and stored. The LUT may be replaced by a mathematical relationship in some circumstances.

In FIG. 11, the lookup table or mathematical relationship is stored in the vehicle. Blocks 250, 252 and 254 are performed as described above. At 270, the AC current signal $I_{AC}$ is injected and the voltage $V_{AC}$ is measured. The leakage resistance $R_{leak}$ is calculated at 284. At 290, the calculated leakage resistance $R_{leak}$ is used to access the LUT and one or more of the calibration values are selected. Interpolation or other estimation methods can be performed if the calculated leakage resistance $R_{leak}$ is located between stored calibration values. Alternately, the LUT can be replaced by a suitable mathematical relationship.

Figure 12:
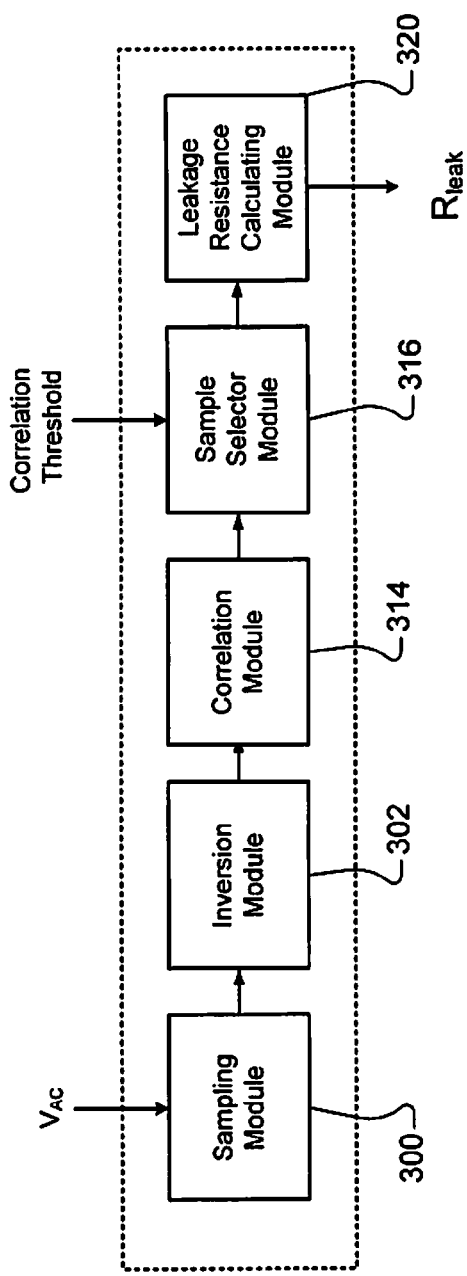
FIG. 12 is a partial functional block diagram of another control module to measure isolation.

Referring now to FIG. 12, an alternate approach is shown. A sampling module 300 samples the voltage $V_{AC}$ in response to the current signal $I_{AC}$. An inversion module 302 inverts negative half cycles of the voltage $V_{AC}$. A correlation module 314 performs a correlation measurement between the half cycles of the voltage $V_{AC}$. A sample selector module 316 selects the half cycles of the voltage $V_{AC}$ having a correlation value above a correlation threshold. The leakage resistance calculating module 320 calculates the leakage resistance $R_{leak}$ from the selected half cycles of the voltage $V_{AC}$.

Figure 13:
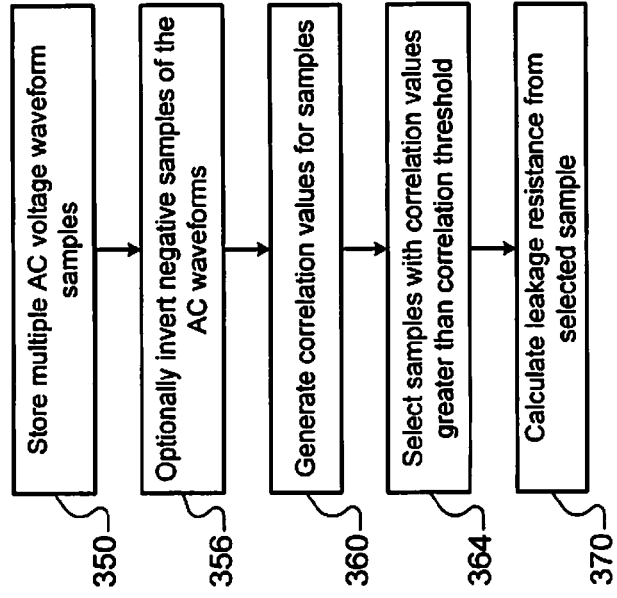
FIG. 13 illustrates an example method for operating the control module of FIG. 12.

Referring now to FIG. 13, a plurality of half cycles of the voltage $V_{AC}$ are stored at 350 while the variable resistance $R_2$ is set to the value occurring at the peak. At 356, negative half cycles of the voltage $V_{AC}$ are inverted. At 360, correlation values are generated for the samples. At 364, control selects samples with correlation values greater than the correlation threshold. At 370, control calculates the leakage resistance $R_{leak}$ from the selected samples. As can be appreciated, correlation can be performed without inversion and also by comparison to stored waveforms such as sine wave values.

There are many advantages provided by the isolation monitoring system according to the present disclosure. The approach described above has relatively high accuracy and does not require a DC path to the chassis. Expensive optical switches are not required. Isolation tests may be performed without the HV battery installed. Measurement results may be validated by the control module for more robust results and fewer false positives or false negatives. There is a high degree of built-in noise immunity in an inherently noise-wise dirty environment. A very small test signal such as 10 uA may be able to produce acceptable results.

The broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A system for measuring a leakage resistance between a high voltage (HV) system of a vehicle and a vehicle chassis, comprising:
   an emulated inductance that is connected between the HV system and the vehicle chassis and that has an inductive reactance that substantially cancels a capacitive reactance between the HV system and the vehicle chassis, wherein the emulated inductance includes a variable resistance;
   a signal source that outputs one of an AC current signal and an AC voltage signal between the HV system and the vehicle chassis;
   a sensor that measures one of:
      an AC current response to the AC voltage signal between the HV system and the vehicle chassis; and
      an AC voltage response to the AC current signal between the HV system and the vehicle chassis; and
   a control module that varies the variable resistance over a range of values, identifies one of the values of the variable resistance that corresponds to a peak voltage associated with the emulated inductance, sets the variable resistance to the one of the values, and calculates the leakage resistance based on the one of the AC current response and the AC voltage response while the variable resistance is set to the one of the values.

2. The system of claim 1, wherein:
   the emulated inductance value is varied based on the variable resistance; and
   the control module adjusts the value of the variable resistance to N different values, where N is an integer greater than one, to vary the inductive reactance of the emulated inductance.

3. The system of claim 2, wherein the control module selects one of the N values that cancels with capacitive reactance between the HV system and the vehicle chassis.

4. The system of claim 1, wherein the emulated inductance further comprises:
   an opamp including an inverting input and a non-inverting input; and
   a first resistance connected between the HV system and the inverting input of the opamp.

5. The system of claim 4, wherein the emulated inductance further comprises:
   a capacitance connected between the HV system and the non-inverting input of the opamp,
   wherein the variable resistance is connected to the non-inverting input.

6. The system of claim 1, further comprising:
   a first capacitance;
   a first resistance;
   a second resistance, wherein the first capacitance, the first resistance and the second resistance are connected in series between the HV system and the vehicle chassis; and
   an analog to digital converter having a first input connected between the first and second resistance and an output connected to the control module.

7. The system of claim 1, wherein the control module includes:
   a sampling module that samples a plurality of half cycles of the one of the AC voltage response and the AC current response; and
   a correlation module that generates a plurality of correlation values corresponding to the plurality of half cycles of the one of the AC voltage response and the AC current response.

8. The system of claim 7, further comprising:
   a leakage calculating module that calculates the leakage resistance based on selected ones of the plurality of half cycles of the one of the AC voltage response and the AC current response having correlation values that are greater than a predetermined correlation value.

9. The system of claim 7, wherein the correlation module generates the plurality of correlation values by correlating each of the plurality of half cycles of the one of the AC voltage response and the AC current response with one of:
   another one of the plurality of half cycles of the one of the AC voltage response and the AC current response; and
   a predetermined waveform.

10. A system for measuring a leakage resistance between a high voltage (HV) system of a vehicle and a vehicle chassis, comprising:
    an emulated inductance that is connected between the HV system and the vehicle chassis and that has an inductive reactance that substantially cancels a capacitive reactance between the HV system and the vehicle chassis;
    a signal source that outputs one of an AC current signal and an AC voltage signal between the HV system and the vehicle chassis;

a sensor that measures one of:
an AC current response to the AC voltage signal between the HV system and the vehicle chassis; and
an AC voltage response to the AC current signal between the HV system and the vehicle chassis; and
a control module that calculates the leakage resistance based on one of:
the AC current signal and the AC voltage response; and
the AC voltage signal and the AC current response, wherein:
the control module generates T values of the leakage resistance, selects S of the T values, where S and T are integers greater than two and S<T, and calculates a final leakage resistance value as a function of the S values; and
the control module selects the S values based on an enable signal received from one of a HV controller and a vehicle system controller.

11. A method for measuring a leakage resistance between a high voltage (HV) system of a vehicle and a vehicle chassis, comprising:
generating an emulated inductance between the HV system and the vehicle chassis;
substantially cancelling a capacitive reactance between the HV system and the vehicle chassis using inductive reactance of the emulated inductance;
generating one of an AC current signal and an AC voltage signal between the HV system and the vehicle chassis;
measuring one of:
an AC current response to the AC voltage signal between the HV system and the vehicle chassis; and
an AC voltage response to the AC current signal between the HV system and the vehicle chassis
varying a variable resistance of the emulated inductance over a range of values;
identifying one of the values of the variable resistance that corresponds to a peak voltage associated with the emulated inductance;
setting the variable resistance to the one of the values; and
calculating the leakage resistance based on the one of the AC current response and the AC voltage response while the variable resistance is set to the one of the values.

12. The method of claim 11, further comprising:
adjusting the variable resistance of the emulated inductance to N different values, where N is an integer greater than one, to vary the inductive reactance of the emulated inductance.

13. The method of claim 12, further comprising:
selecting one of the N values that substantially cancels with capacitive reactance between the HV system and the vehicle chassis.

14. The method of claim 11, further comprising:
generating T values of the leakage resistance;
selecting S of the T values, where S and T are integers greater than two and S<T; and
calculating a final leakage resistance value as a function of the S values.

15. The method of claim 11, further comprising:
sampling a plurality of half cycles of the one of the AC voltage response and the AC current response; and
generating a plurality of correlation values corresponding to the plurality of half cycles of the one of the AC voltage response and the AC current response.

16. The method of claim 15, further comprising:
calculating the leakage resistance based on selected ones of the plurality of half cycles of the one of the AC voltage response and the AC current response having correlation values that are greater than a predetermined correlation value.

17. The method of claim 15, wherein the plurality of correlation values are generated by correlating each of the plurality of half cycles of the one of the AC voltage response and the AC current response with one of:
another one of the plurality of half cycles of the one of the AC voltage response and the AC current response; and
a predetermined waveform.

* * * * *

UNITED STATES PATENT AND TRADEMARK OFFICE
CERTIFICATE OF CORRECTION

PATENT NO. : 8,598,897 B2  
APPLICATION NO. : 13/012140  
DATED : December 3, 2013  
INVENTOR(S) : Mehmet Kadri Nalbant Page 1 of 2

It is certified that error appears in the above-identified patent and that said Letters Patent is hereby corrected as shown below:

In the Drawings:

| | |
|---|---|
| Sheet 7 of 11, Fig. 6 | Delete "R1" and insert --$R_1$-- |
| Sheet 7 of 11, Fig. 6 | Delete "R2" and insert --$R_2$-- |
| Sheet 7 of 11, Fig. 6 | Delete "Rs" and insert --$R_s$-- |
| Sheet 7 of 11, Fig. 6 | Delete "Ls" and insert --$L_s$-- |
| Sheet 7 of 11, Fig. 6 | Delete "Lp" and insert --$L_p$-- |
| Sheet 7 of 11, Fig. 6 | Delete "Rp" and insert --$R_p$-- |

In the Specification:

| | |
|---|---|
| Column 3, Line 44 | After "disclosure;", delete "and" |
| Column 3, Line 61 | Delete "logical or" and insert --logical OR-- |
| Column 4, Line 36 | Delete "use" and insert --used-- |
| Column 4, Line 47 | After "HV", insert --battery-- |

Column 5, Lines 46-51 (approx.) Delete "
$$Rs = \frac{R1 \cdot (1 + R1 \cdot R2 \cdot \omega^2 \cdot C^2)}{1 + R1^2 \cdot \omega^2 \cdot C^2};$$
$$LS = \frac{R1 \cdot (R2 - R1) \cdot C}{1 + R1^2 \cdot \omega^2 \cdot C^2}$$
"
and insert --
$$R_s = \frac{R_1 \cdot (1 + R_1 \cdot R_2 \cdot \omega^2 \cdot C^2)}{1 + R_1^2 \cdot \omega^2 \cdot C^2};$$
$$L_s = \frac{R_1 \cdot (R_2 - R_1) \cdot C}{1 + R_1^2 \cdot \omega^2 \cdot C^2}$$
--

Signed and Sealed this  
Fourteenth Day of October, 2014

*Michelle K. Lee*  
Michelle K. Lee  
*Deputy Director of the United States Patent and Trademark Office*

CERTIFICATE OF CORRECTION (continued)
U.S. Pat. No. 8,598,897 B2

Column 5, Lines 56-61 (approx.)     Delete "$Rp = \frac{\omega^2 \cdot Ls^2 + RS^2}{RS}$; and $Lp = \frac{\omega^2 \cdot Ls^2 + Rs^2}{\omega^2 \cdot Ls}$"

and insert -- $R_p = \frac{\omega^2 \cdot L_s^2 + R_s^2}{R_s}$; and $L_p = \frac{\omega^2 \cdot L_s^2 + R_s^2}{\omega^2 \cdot L_s}$ --

Column 7, Line 37     Delete "uA" and insert --μA--

In the Claims:

Column 9, Line 33, Claim 14     After "chassis", insert --;--